United States Patent
Murugesan et al.

(10) Patent No.: US 11,322,945 B2
(45) Date of Patent: *May 3, 2022

(54) ENERGY FLOW PREDICTION FOR ELECTRIC SYSTEMS INCLUDING PHOTOVOLTAIC SOLAR SYSTEMS

(71) Applicant: SunPower Corporation, San Jose, CA (US)

(72) Inventors: Sugumar Murugesan, Foster City, CA (US); Saravanan Thulasingam, Austin, TX (US)

(73) Assignee: SUNPOWER CORPORATION, San Jose, CA (US)

( * ) Notice: Subject to any disclaimer, the term of this patent is extended or adjusted under 35 U.S.C. 154(b) by 313 days.

This patent is subject to a terminal disclaimer.

(21) Appl. No.: 16/730,186

(22) Filed: Dec. 30, 2019

(65) Prior Publication Data

US 2020/0136392 A1    Apr. 30, 2020

Related U.S. Application Data

(63) Continuation of application No. 15/346,383, filed on Nov. 8, 2016, now Pat. No. 10,523,010.

(51) Int. Cl.
*G06G 7/54* (2006.01)
*H02J 3/38* (2006.01)
(Continued)

(52) U.S. Cl.
CPC .............. *H02J 3/383* (2013.01); *G06F 30/20* (2020.01); *G06N 20/00* (2019.01); *H02J 3/38* (2013.01);
(Continued)

(58) Field of Classification Search
CPC ... H02S 50/00; H02J 3/38; H02J 3/383; H02J 13/0079; G06N 5/04; G06N 20/00; G06F 30/20; G06F 17/5009
(Continued)

(56) References Cited

U.S. PATENT DOCUMENTS 7,622,912 B1    11/2009    Adams et al.
8,350,417 B1    1/2013    Dooley et al.
(Continued)

OTHER PUBLICATIONS

Notice of Allowance and Fee(s) Due for U.S. Appl. No. 15/346,383 (dated Aug. 21, 2019).
(Continued)

*Primary Examiner* — Andre Pierre Louis
(74) *Attorney, Agent, or Firm* — Jenkins, Wilson, Taylor & Hunt, P.A.

(57) ABSTRACT

Methods, systems, and computer storage media are disclosed for determining electric energy flow predictions for electric systems including photovoltaic solar systems. In some examples, a method is performed by a computer system and includes supplying a consumption time series and a predicted production time series for an electric system to a machine-learning predictor trained during a prior training phase using electric energy consumption training data and photovoltaic production training data. The consumption time series has a first data resolution, and the electric energy consumption training data and the photovoltaic production training data have a second data resolution greater than the first data resolution. The method includes determining, using an output of the machine-learning predictor, a predicted import time series of electric import values each specifying an amount of electric energy predicted to be imported by the electric system with a prospective photovoltaic solar system installed.

17 Claims, 7 Drawing Sheets

(51) Int. Cl.
*H02S 50/00* (2014.01)
*G06N 20/00* (2019.01)
*H02J 13/00* (2006.01)
*G06F 30/20* (2020.01)

(52) U.S. Cl.
CPC .......... *H02J 13/0079* (2013.01); *H02S 50/00* (2013.01); *H02J 2203/20* (2020.01); *Y02E 10/56* (2013.01); *Y02E 40/70* (2013.01); *Y02E 60/00* (2013.01); *Y04S 10/123* (2013.01); *Y04S 40/20* (2013.01)

(58) Field of Classification Search
USPC ..................................................... 703/13, 18
See application file for complete search history.

(56) References Cited

U.S. PATENT DOCUMENTS

| | | | |
|---|---|---|---|
| 8,352,220 | B2 | 1/2013 | Wayne et al. |
| 8,548,637 | B2 | 10/2013 | Lenox |
| 8,774,007 | B2 | 7/2014 | Hussain et al. |
| 9,946,571 | B1 | 4/2018 | Brown et al. |
| 10,523,010 | B2 | 12/2019 | Murugesan et al. |
| 2013/0166266 | A1 | 6/2013 | Herzig et al. |
| 2013/0190939 | A1 | 7/2013 | Lenox |
| 2015/0186904 | A1 | 7/2015 | Guha et al. |
| 2016/0306906 | A1 | 10/2016 | McBrearty et al. |
| 2017/0005515 | A1* | 1/2017 | Sanders ................... H02J 3/14 |
| 2018/0131190 | A1 | 5/2018 | Murugesan et al. |

OTHER PUBLICATIONS

First Action Interview Pilot Program Pre-Interview Communication for U.S. Appl. No. 15/346,383 (dated Jun. 27, 2019).
Jadhav et al., "Forecasting Energy Consumption using Machine Learning," pp. 1-15 (Jan. 18, 2016).
Dobos, "PVWatts Version 5 Manual," National Renewable Energy Laboratory, Technical Report NREL/TP-6A20-62641, pp. 1-20 (Sep. 2014).
Blair et al., "System Advisor Model, SAM 2014.1.14: General Description," National Renewable Energy Laboratory, Technical Report NREL/TP-6A20-61019, pp. 1-19 (Feb. 2014).
Perera et al., "Machine Learning Techniques for Supporting Renewable Energy Generation and Integration: A Survey," pp. 1-16 (2014).

* cited by examiner

ENERGY FLOW PREDICTION FOR ELECTRIC SYSTEMS INCLUDING PHOTOVOLTAIC SOLAR SYSTEMS

PRIORITY CLAIM

This application is a continuation of U.S. patent application Ser. No. 15/346,383, filed Nov. 8, 2016, the disclosure of which is incorporated herein by reference in its entirety.

BACKGROUND

The subject matter described in this specification relates generally to computer systems programmed for determining electric energy flow predictions for electric systems including photovoltaic solar systems.

Photovoltaic cells, commonly known as solar cells, are devices for conversion of solar radiation into electric energy. A photovoltaic solar system typically includes a panel of multiple photovoltaic cells on a frame, one or more inverters, and interconnection wiring. A photovoltaic solar system can also include other optional components such as batteries, solar trackers, and a meteorological station. The frame can be mounted on top of a building and the other components can be located on the outside or inside of the building to interface with an electric grid of the building and, in some cases, a utility electric grid. A utility company may charge a customer based on both energy consumption from the utility electric grid and energy production by the photovoltaic solar system.

SUMMARY

A computer system is programmed for determining electric energy flow predictions for electric systems including photovoltaic solar systems. The computer system can be useful, e.g., for determining accurate predictions of electric import values based on energy consumption data recorded at a lower resolution than a metering resolution used by an electric utility. In some examples, the computer system includes memory storing one or more computer programs and one or more processors configured to execute the one or more computer programs to perform a method for electric energy flow prediction.

In some examples, the method includes supplying a consumption time series and a predicted production time series for an electric system to a machine-learning predictor trained during a prior training phase using electric energy consumption training data and photovoltaic production training data. The consumption time series has a first data resolution, and the electric energy consumption training data and the photovoltaic production training data have a second data resolution greater than the first data resolution. The method includes determining, using an output of the machine-learning predictor, a predicted import time series of electric import values each specifying an amount of electric energy predicted to be imported by the electric system with a prospective photovoltaic solar system installed.

The computer systems described in this specification may be implemented in hardware, software, firmware, or combinations of hardware, software and/or firmware. The computer systems described in this specification may be implemented using a non-transitory computer storage medium storing one or more computer programs that, when executed by one or more processors, cause the one or more processors to perform the method for electric energy flow prediction for photovoltaic solar systems. Computer storage media suitable for implementing the computer systems described in this specification include non-transitory computer storage media, such as disk memory devices, chip memory devices, programmable logic devices, random access memory (RAM), read only memory (ROM), optical read/write memory, cache memory, magnetic read/write memory, flash memory, and application specific integrated circuits. A computer storage medium used to implement the computer systems described in this specification may be located on a single device or computing platform or may be distributed across multiple devices or computing platforms.

DETAILED DESCRIPTION

Figure 1:
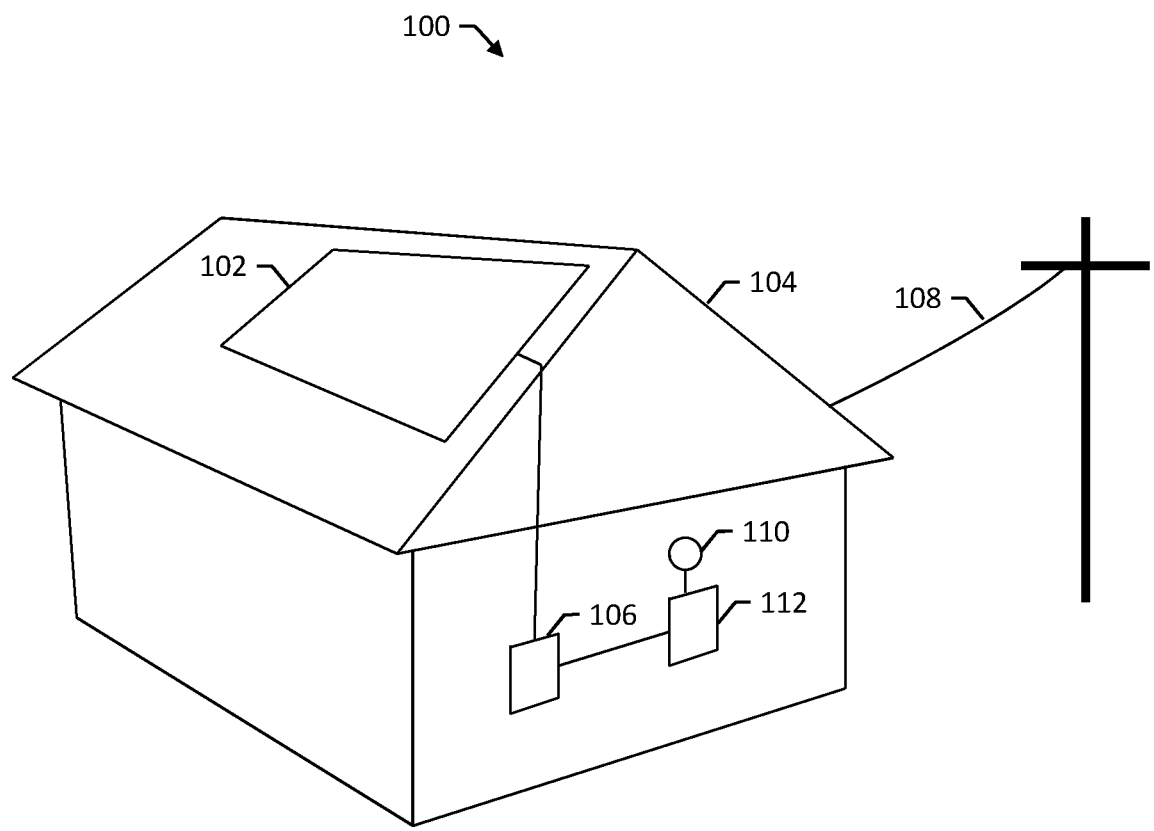
FIG. 1 is a diagram of an example electric system.

FIG. 1 is a diagram of an example electric system 100. The electric system 100 includes one or more photovoltaic solar panels 102 mounted on a building 104 and one or more inverters 106 coupled to the photovoltaic solar panels 102. The electric system 100 also includes a connection 108 to a utility grid, an electric meter 110 for the connection 108 to the utility grid, and an electric panel 112 for the electric system 100.

When the sun is shining on the photovoltaic solar panels 102, the photovoltaic solar panels 102 produce direct current (DC) electric power and provide the DC power to the inverters 106. In response, the inverters 106 provide alternating current (AC) power for consumption by one or more loads on the electric system 100 or for exporting to the connection 108 to the utility grid. The loads can be located, e.g., inside or outside the building 104.

When the loads on the electric system 100 are consuming more electric energy than the photovoltaic solar panels 102 are producing, the electric system 100 imports electric energy from the connection 108 to the utility grid. When the loads are consuming less electric energy than the photovoltaic solar panels 102 are producing, the electric system 100 can export the excess electric energy to the connection 108 to the utility grid. Some electric utilities do not allow or compensate for energy export, so that when the loads are consuming less electric energy than the photovoltaic solar panels 102 are producing, the excess electric energy may be unused.

When a manager of the electric system 100 considers installing a prospective photovoltaic solar system with the electric system 100, the manager faces a number of choices. The manager selects an installer or manufacturer or both for the photovoltaic solar panels 102. The manager may also select a physical configuration of the photovoltaic solar system (e.g., number and dimensions of solar panels, orientation of solar panels, photovoltaic efficiency of solar cells in the solar panels), a financing option (e.g., cash or lease), and a utility rate structure (e.g., fixed, tiered, or time of use).

A utility rate structure typically includes one or more rules that specify how electric usage will be billed to the electric utility. For example, in a fixed rate structure, total electric usage over a time period is multiplied by a fixed billing rate to determine the cost of the usage over that time period. In a tiered rate structure, electric usage is billed at one rate up to a certain amount and then billed at a different rate over that amount, and there may be several tiers each having a respective billing rate. In a time of use structure, electric usage can be billed based on the time of day of consumption, e.g., so that a higher billing rate applies during peak consumption hours.

Some utility rate structures impose a charge based on net-metering balancing. For example, suppose that the electric meter 110 increases the metered consumption while the electric system 100 is importing energy and decreases the metered consumption while the electric system 100 is exporting energy, e.g., the electric meter 110 may spin backwards. The electric utility may use a net-metering balancing rate structure and record the metered consumption at periodic intervals, e.g., once per hour or day or month, and then charge the manager of the electric system 100 based on the recorded consumption.

Furthermore, some utility rate structures impose a charge based on each unit of energy imported in a metered interval in addition to net-metering balancing. For example, under such a rate structure, the electric utility may charge for consumption during a period of time even when the photovoltaic solar panels 102 produced as much energy in total as the loads consumed over the period of time, if the loads at any time during the period of time consumed more energy than the photovoltaic solar panels 102 were producing at that time, resulting in a non-zero import from the utility grid.

For an electric system manager considering installing a prospective photovoltaic solar system under such a rate structure, determining accurate predictions of instantaneous electric import values can be useful for various purposes. For example, accurate predictions of instantaneous electric import values can be useful in determining whether or not to install the prospective photovoltaic solar system, determining an appropriate physical configuration for the prospective photovoltaic solar system, and predicting cost reductions or other financial information. Determining accurate predictions of instantaneous electric import values, however, may be challenging where available energy consumption data has a lower resolution than a metering resolution used by the electric utility.

Figure 2A:
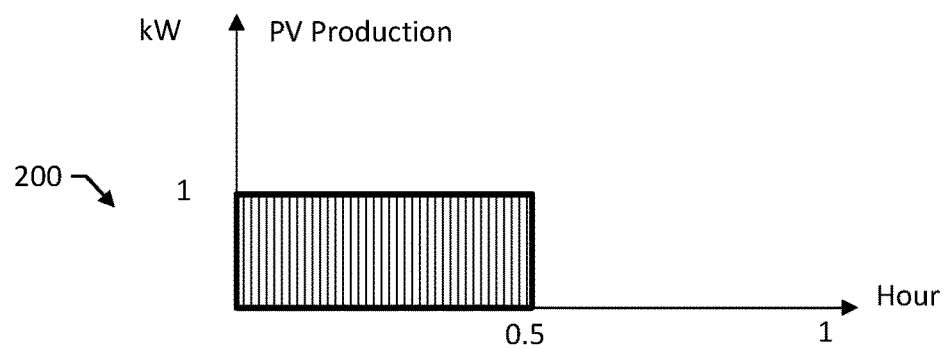
FIGS. 2A-C are example electric energy consumption and photovoltaic production plots.
Figure 2A:
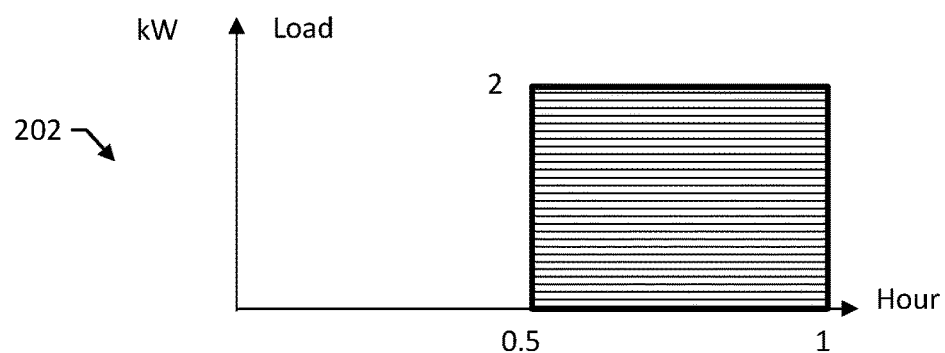
Figure 2B:
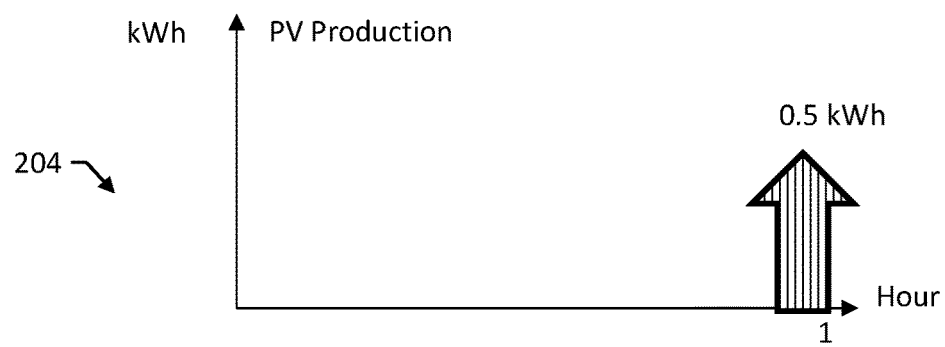
Figure 2B:
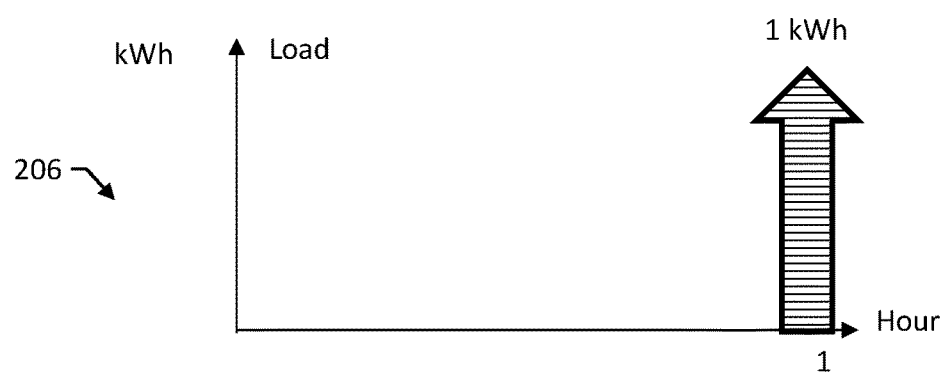
Figure 2C:
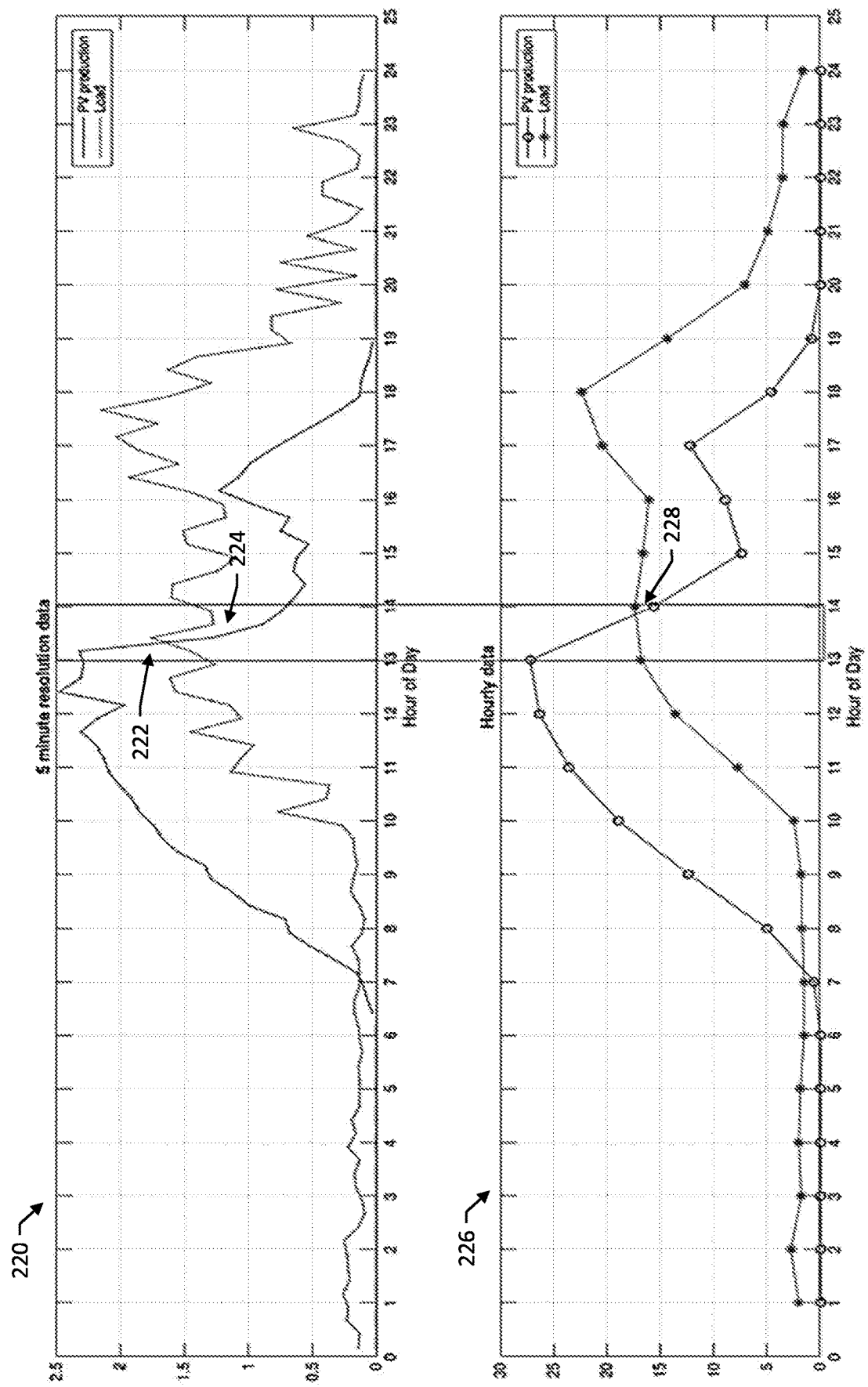

FIGS. 2A-C are example electric energy consumption and photovoltaic production plots. FIGS. 2A-C illustrate at least some of the challenges in determining accurate predictions of instantaneous electric import values.

FIG. 2A shows instantaneous electric energy import and export data for an example electric system. The data is instantaneous in that the data is recorded at a high resolution, e.g., the data is spaced apart by time intervals that are shorter than an hour. FIG. 2A shows a first chart 200 of a production time series of electric production values for an example photovoltaic solar system installed with the electric system and a second chart 202 of a consumption time series of electric consumption values for one or more loads of the electric system. The consumption time series corresponds to the production time series in that the timelines of each chart 200 and 202 refer to the same times, i.e., the charts 200 and 202, taken together, show the electric energy being imported or exported by the system as a whole for each time on the charts 200 and 202.

The first chart 200 shows that the photovoltaic solar system produced 1 kW constantly over the first half hour of an hour time period and zero kW for the second half hour of the hour time period. The second chart 202 shows that the loads consumed zero kW constantly over first half hour of the hour time period and consumed 2 kW constantly for the second half hour of the hour time period. Therefore, over the hour time period, the electric system imported 1 kWh, which happened during the second half hour. Over the hour time period, the electric system exported 0.5 kWh, which happened during the first half hour.

FIG. 2B shows low resolution energy import and export data for the example electric system over the same period of time as shown in FIG. 2A. The data is low resolution because the data is spaced apart by time intervals that are longer than a metering resolution used by an electric utility, e.g., the data is recorded at one hour intervals whereas the metering resolution is instantaneous. FIG. 2B shows a first chart 204 of a production time series for the example photovoltaic solar system and a second chart 202 of a consumption time series for the loads of the electric system. The consumption time series corresponds to the production time series.

The first chart 204 shows that, at the low resolution, the photovoltaic solar system appeared to produce 0.5 kWh, and the second chart shows that, at the low resolution, the loads appeared to consume 1 kWh. Therefore, taken together, the electric system appeared, at the low resolution, to import 0.5 kWh and export 0 kWh over the hour. Under a utility rate structure that imposed charges based on net-metering balancing, the charge for the illustrated hour would be the same regardless of whether the data was high resolution, as in FIG. 2A, or low resolution, as in FIG. 2B. The high resolution data in FIG. 2A, however, shows that the charges would be higher under a utility rate structure that imposed charges based on each unit of energy imported in a metered interval in addition to net-metering balancing, whereas the low resolution data in FIG. 2B lacks this information.

FIG. 2C further illustrates the difference by showing a first chart 220 of example electric energy flows at a high resolution (e.g., five minute intervals) and a second chart 226 of the example electric energy flows at a low resolution (e.g., hourly intervals). The first chart 220 shows a production time series and a consumption series. Between hours 13 and 14, the amount of energy imported is shown as the area 222 between the two curves where consumption is greater and the amount of energy exported is shown as the area 224 between the two curves where production is greater.

The second chart 226 shows the production time series and the consumption series downsampled to the low resolution. Between hours 13 and 14, the amount of energy imported is shown as the difference 228 between the two curves. Determining predicted import values using the second chart 226 would potentially lack the information regarding the energy imported shown as the area 222 in the first chart 220. In cases where available data is recorded at the low resolution, predicted import values may not be accurate, which can significantly alter energy and financial predictions in certain utility rate structures, e.g., under a utility rate structure that imposes charges based on each unit of energy imported in a metered interval in addition to net-metering balancing.

The differences between the high resolution data and the low resolution data can result in self-consumption error.

Self-consumption per unit time is the amount of produced photovoltaic electric energy that was consumed by the electrical system per unit time. Self-consumption can be expressed as, e.g., a function of consumption/production ratio or minimum of consumption and production values, and as a percentage or as an absolute value. In some examples, the computer systems described in this specification are programmed to determine self-consumption as an absolute value of minimum of consumption and production values. The computer systems can be programmed to determine self-consumption error as the difference between a self-consumption determined using high resolution data and a self-consumption determined using low resolution data.

Figure 3:
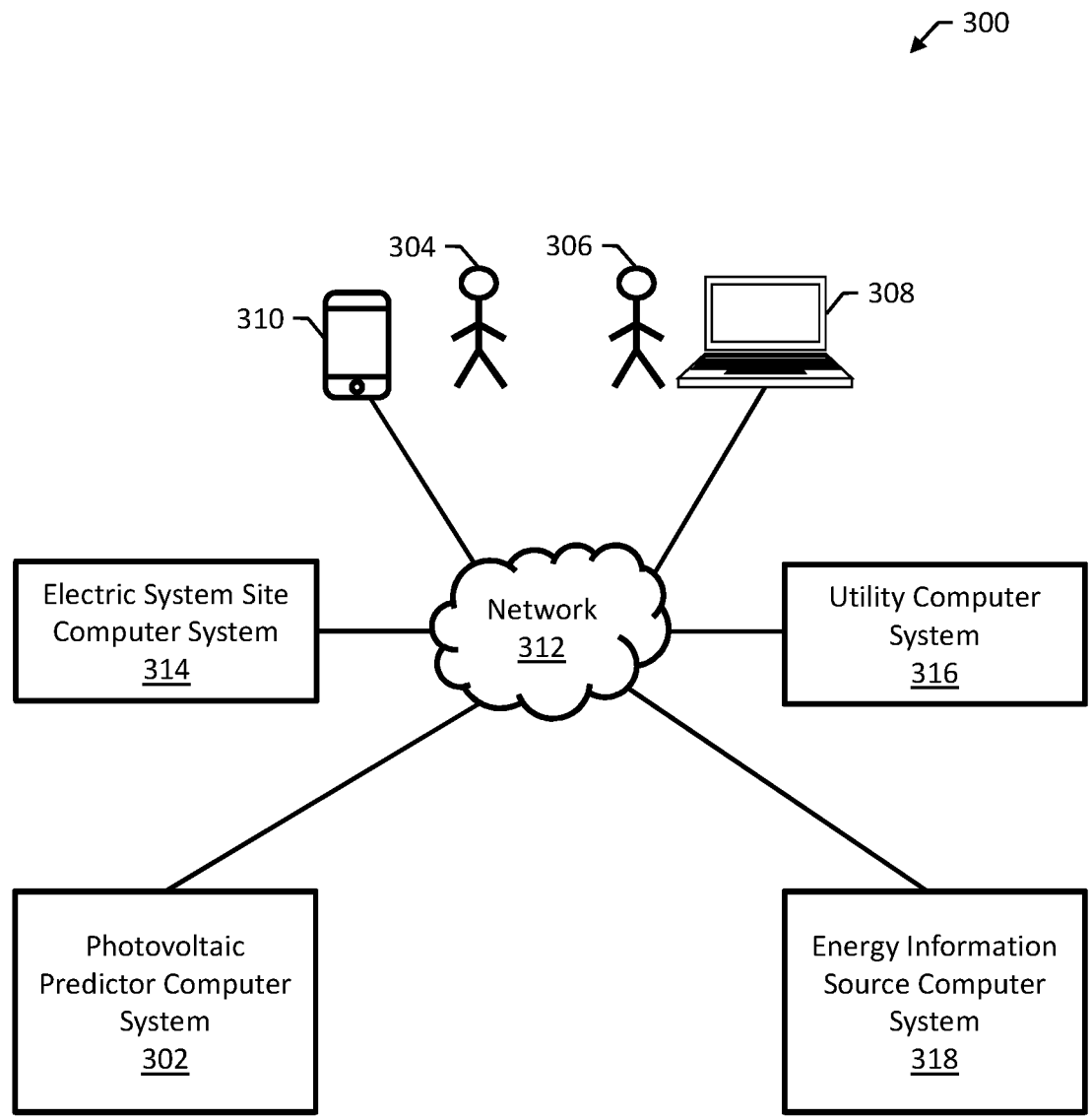
FIG. 3 is a block diagram illustrating an example network environment of a photovoltaic predictor computer system.

FIG. 3 is a block diagram illustrating an example network environment 300 of a photovoltaic predictor computer system 302 programmed for determining electric energy flow predictions for electric systems including photovoltaic solar systems, e.g., the example electric system 100 of FIG. 1.

A manager 304 of an electric system is considering a prospective photovoltaic solar system. For example, the manager 304 may be in a procurement process for the photovoltaic solar system, or the manager 304 may have recently installed the photovoltaic solar system and lacks certain kinds of predictions regarding the installed system. The manager 304 can be a residential homeowner or a commercial building manager or any appropriate individual associated with the electric system. The manager 304 consults with an installer 306 of photovoltaic solar systems.

The installer 306 operates a user device 308 to communicate with the photovoltaic predictor computer system 302 over a data communications network 312. The manager 304 may also operate a user device 310. The user devices 308 and 310 can each be any appropriate computer system, e.g., a computer system with a display and a user input device such as a personal computer, laptop, or tablet computer. The photovoltaic predictor computer system 302 can be implemented as a cloud-based service, e.g., as a server implemented on a distributed computing platform.

The photovoltaic predictor computer system 302 is programmed to import electric energy flow data from one or more of various sources including the installer's user device 308, the manager's user device 310, a computer system 314 located at a site of the electric system and coupled to an electric meter of the electric system, a utility computer system 316, and an external energy information source computer system 318. The photovoltaic predictor computer system 302 is programmed for determining energy flow predictions and presenting results for display on the installer's user device 308 or the manager's user device 310 or both. The results can include, for example, a target physical configuration of the prospective photovoltaic solar system or a predicted energy cost reduction or both.

In some examples, the installer 306 executes a web browser on the user device 308 and enters a uniform resource locator (URL) into the web browser for the photovoltaic predictor computer system 302. The photovoltaic predictor computer system 302 executes a web server that provides a graphical user interface (GUI) to the user device 308, e.g., as one or more web pages which can be comprised of hypertext markup language (HTML) files and image files. The installer 306 can then supply data to the photovoltaic predictor computer system 302 using the GUI, and the photovoltaic predictor computer system 302 can provide results on one or more display screens of the GUI. Based on the results, the manager 304 may have the installer 306 install the target physical configuration of the prospective photovoltaic solar system with the electric system.

The photovoltaic predictor computer system 302 is programmed for supplying a consumption time series and a predicted production time series for the electric system to a machine-learning predictor trained during a prior training phase using electric energy consumption training data and photovoltaic production training data. The consumption time series has a first data resolution, and the electric energy consumption training data and the photovoltaic production training data have a second data resolution greater than the first data resolution. The photovoltaic predictor computer system 302 determines, using an output of the machine-learning predictor, a predicted import time series of electric import values each specifying an amount of electric energy predicted to be imported by the electric system with the prospective photovoltaic solar system installed.

Figure 4:
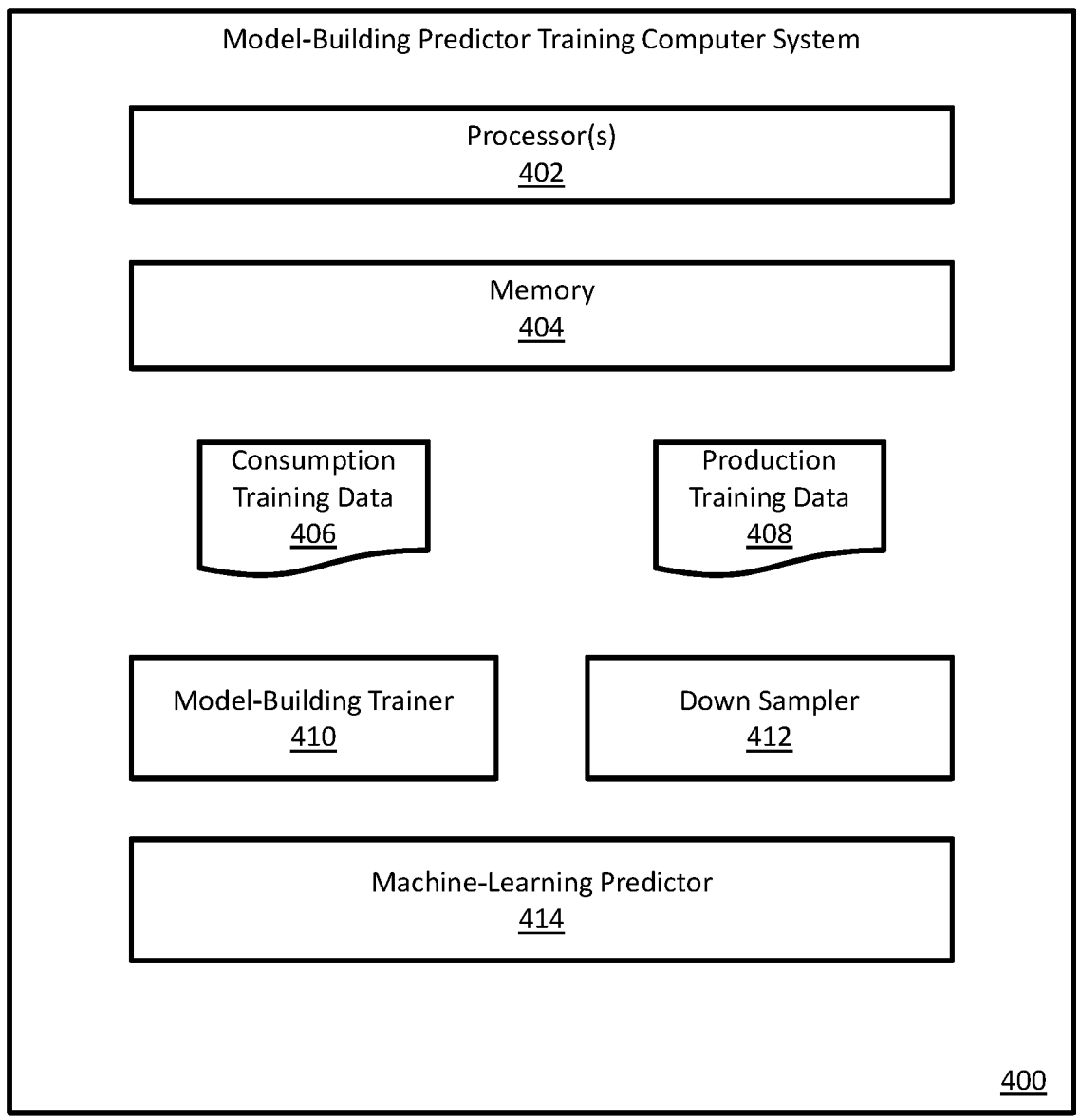
FIG. 4 is a block diagram of an example computer system programmed for training a machine-learning predictor during a training phase.

FIG. 4 is a block diagram of an example computer system 400 programmed for training a machine-learning predictor 414 during a training phase. The computer system 400 includes one or more processors 402 and memory 404 storing one or more computer programs for execution by the processors 402.

The memory 404 stores electric energy consumption training data 406 and photovoltaic production training data 408. The electric energy consumption training data 406 and the photovoltaic production training data 408 include energy values spaced apart by time intervals at a high resolution, e.g., a resolution greater than or equal to a metering resolution used by an electric utility. The electric energy consumption training data 406 can include consumption training sets, with each set including a time series of electric energy consumption values.

The photovoltaic production training data 408 then includes production training sets each corresponding to a respective consumption training set. Each production training set includes a time series of photovoltaic production values. The electric energy consumption training data 406 and the photovoltaic production training data 408 can include simulated data or recorded data from live systems or both.

The computer system 400 includes a model-building trainer 410, a down sampler 412, and a machine-learning predictor 414 which can each be implemented as one or more computer programs stored in the memory 404. In operation, the model-building trainer 410 supplies the electric energy consumption training data 406 and the photovoltaic production training data 408 to the machine-learning predictor 414. The down sampler 412 downsamples the electric energy consumption training data 406 and the photovoltaic production training data 408 to a low resolution, e.g., a resolution used by electric energy consumption metering systems. The model-building trainer 410 supplies the downsampled electric energy consumption training data and the downsampled photovoltaic production training data to the machine-learning predictor 414.

The model-building trainer 410 configures the machine-learning predictor 414 to build a model to minimize the self-consumption error between the electric energy consumption training data 406, the photovoltaic production training data 408, and the downsampled electric energy consumption training data and the downsampled photovoltaic production training data. The machine-learning predictor 414 can be implemented using any appropriate computer code for automating analytical model building. For example, the machine-learning predictor 414 can be implemented by computer code for carrying out one or more structured prediction algorithms.

The model-building trainer 410 can configure the machine-learning predictor 414 to build the model by determining self-consumption error as a difference between a first self-consumption determined at the low resolution and a second self-consumption determined at the high resolution. For example, the model-building trainer 410 can configure the machine-learning predictor 414 to determine the first self-consumption as a minimum of a downsampled consumption training data and a corresponding downsampled production training data. The model-building trainer 410 can then configure the machine-learning predictor 414 to determine the second self-consumption as a minimum of the consumption training data at second resolution and the production training data at second resolution.

In some examples, configuring the machine-learning predictor to build the model to minimize self-consumption error comprises grouping production and consumption values for each time interval of the downsampled electric energy consumption training data and the downsampled photovoltaic production training data into data classification bins. The data classification bins are established based on a difference between the consumption value and the production value in the time interval. Then, the data classification bins are mapped to an average self-consumption error calculated as the average of self-consumption errors of all production and consumption values grouped into the data classification bins.

In some examples, the electric energy consumption training data 406 and the photovoltaic production training data 408 are divided into portions corresponding to photovoltaic solar system conditions, e.g., geographic locations or seasons of the year or both. Then, the model-building trainer 410 can configure the machine-learning predictor 414 to build models for each portion. For example, the training data can be divided into four portions each corresponding to a respective season of the year, and configuring the machine-learning predictor 414 to build the model includes configuring the machine-learning predictor 414 to separately model each of the portions corresponding to the seasons.

Figure 5:
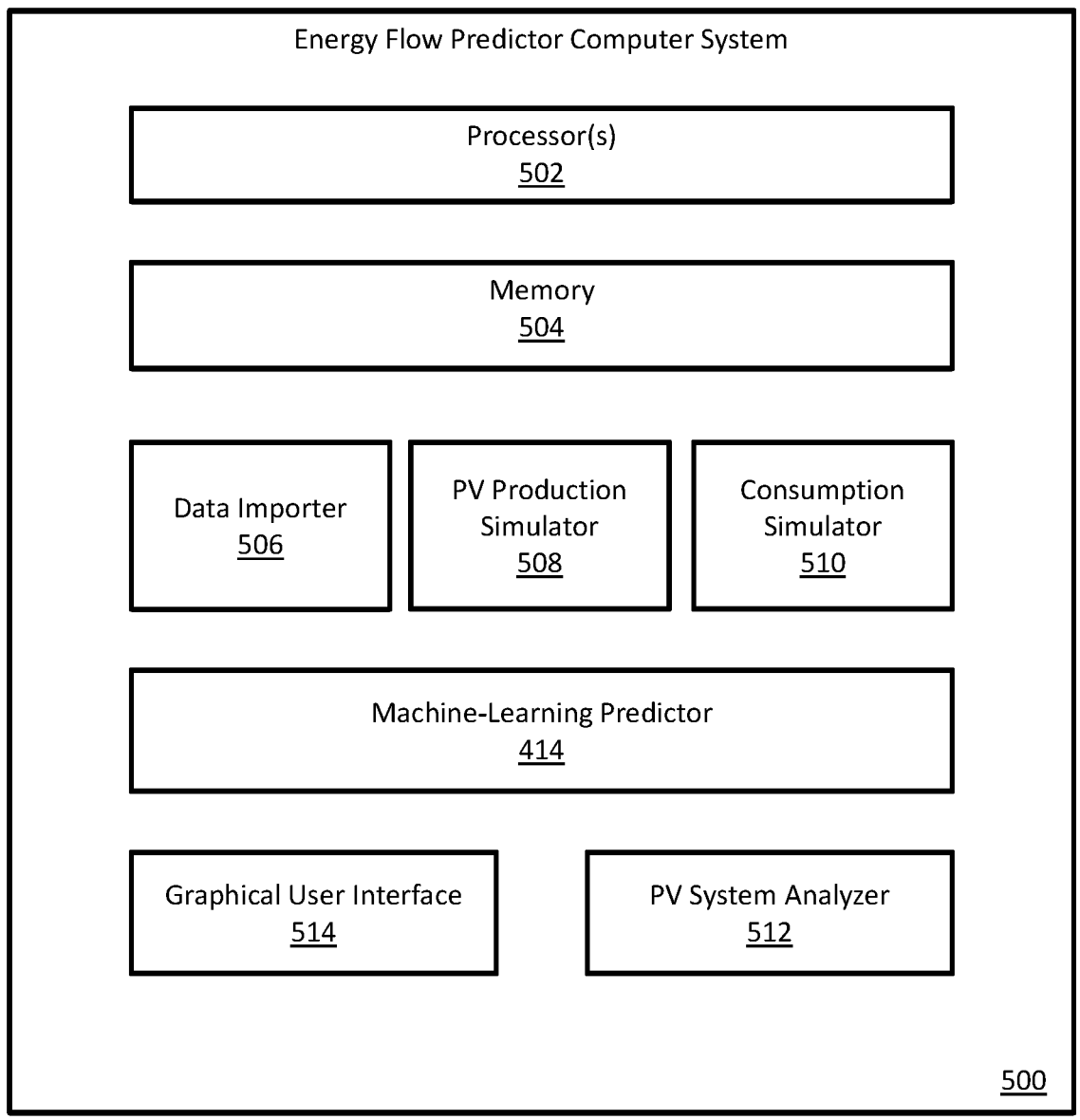
FIG. 5 is a block diagram of an example computer system programmed for determining electric energy flow predictions for electric systems including photovoltaic solar systems.

FIG. 5 is a block diagram of an example computer system 500 programmed for determining electric energy flow predictions for electric systems including photovoltaic solar systems. The computer system 500 can implement the photovoltaic predictor computer system 302 of FIG. 3.

The computer system 500 includes one or more processors 502 and memory 504 storing one or more computer programs for execution by the processors 502. The computer system 500 includes a data importer 506, a photovoltaic production simulator 508, and a consumption simulator 510 which can each be implemented as one or more computer programs stored in the memory 504. The computer system 500 further includes the machine-learning predictor 414 of FIG. 4, a graphical user interface (GUI) 514, and a photovoltaic system analyzer 512 which can each be implemented as one or more computer programs stored in the memory 504.

In operation, the data importer 506 receives a consumption time series of electric consumption values for an electric system and a predicted production time series of electric production values for a prospective photovoltaic solar system for installation with the electric system. The electric consumption values of the consumption time series are spaced apart by time intervals at a low resolution. The electric production values may also be spaced apart by time intervals at the low resolution or the electric production values may be downsampled to the low resolution.

For example, the data importer 506 can receive a measured consumption time series from a metering system of the electric system (e.g., computer system 314 in FIG. 3) or from a utility metering computer system remote from the electric system (e.g., computer system 316 in FIG. 3). In another example, the data importer 506 can execute the consumption simulator 510 to computationally simulate the electric system. The consumption simulator 510 can simulate electric energy consumption of the electric system based on, e.g., a geographic location of the electric system and one or more physical characteristics of a building housing at least a portion of the electric system.

In some examples, the consumption simulator 510 uses retrieves external data from an external source, e.g., the external energy information source computer system 318 of FIG. 3. The external data can include various appropriate datasets such as commercial and residential hourly load profiles for various geographic locations, electric utility rate structures organized by geographic locations, and a library of uniquely identifiable building components that represent physical characteristics of buildings such as roofs, walls, and windows.

Receiving the predicted production time series can include executing the photovoltaic production simulator 508 to computationally simulate the prospective photovoltaic solar system installed with the electric system using a geographic location of the electric system, an orientation of the prospective photovoltaic solar system, and a photovoltaic efficiency of the prospective photovoltaic solar system. The photovoltaic production simulator 508 can also use historical weather data and any other appropriate data to computationally simulate the production of the photovoltaic solar system. In some examples, the installer 306 supplies data characterizing the photovoltaic efficiency of the prospective photovoltaic solar system.

The GUI 514 can be implemented using any appropriate user interface technology, e.g., as one or more web pages hosted by a web server. For example, the GUI 514 can provide web pages for presentation on the installer's user device 308 of FIG. 3 or the manager's user device 310 or both. The installer 306 or the manager 304 can then use the GUI 514 to direct the data importer 506 to receive data for the manager's electric system and prospective photovoltaic solar system.

For example, the manager 304 can use the GUI 514 to upload historical consumption data for electric energy consumption of the manager's electric system. The installer 306 can use the GUI 514 to direct the photovoltaic production simulator 508 to simulate one or more physical configurations of the prospective photovoltaic solar system at a site of the electric system. The computer system 500 can then present results to the installer 304 or the manager 308 or both using the GUI 514.

The machine-learning predictor 414 predicts electric energy import and export values for the electric system with the prospective photovoltaic solar system installed, or equivalently electric energy self-consumption values. The electric energy values can be spaced apart by time intervals at a low resolution. The machine-learning predictor 414 uses the low resolution consumption data and the model built during the prior training phase to predict the electric energy values.

The photovoltaic system analyzer 512 uses the predicted import time series to determine results for the electric system and the prospective photovoltaic solar system. For example, the photovoltaic system analyzer 512 can predict a cost reduction for the prospective photovoltaic solar system using a utility rate structure, e.g., a utility rate structure that imposes charges based on each unit of energy imported in a metered interval in addition to net-metering balancing. Predicting a cost reduction can include determining a predicted cost of consumption without the prospective photovoltaic solar system installed using the received consumption time series and the utility rate structure, determining a predicted cost of consumption with the prospective photovoltaic solar system installed using the predicted import and export time series and the utility rate structure, and determining a difference between the two predicted costs.

In some examples, the photovoltaic system analyzer 512 determines a target physical configuration of the prospective photovoltaic solar system. The photovoltaic system analyzer 512 can determine predicted cost reductions with several different sizes and orientations of photovoltaic solar systems, e.g., different numbers and/or sizes of panels and solar cells. For example, the installer 306 may supply data characterizing available sizes of panels and solar cells, and the manager 304 may supply data characterizing available area and orientations for the panels. Then, the photovoltaic system analyzer 512 determines, as the target physical configuration, the configuration resulting in the greatest cost reduction.

The photovoltaic system analyzer 512 can also determine the target physical configuration using the best return on investment (ROI), or net present value (NPV). In some examples, if the manager 304 is subject to a tiered rate structure, the photovoltaic system analyzer 512 can determine a minimum size to prevent the net consumption of the electric system from exceeding a threshold that triggers a higher billing rate. The target physical configuration can be specified using any appropriate metric, e.g., by physical dimensions, Kilo-Watt rating, Kilo-Watt-Hour production, or any appropriate measure of energy production.

Figure 6:
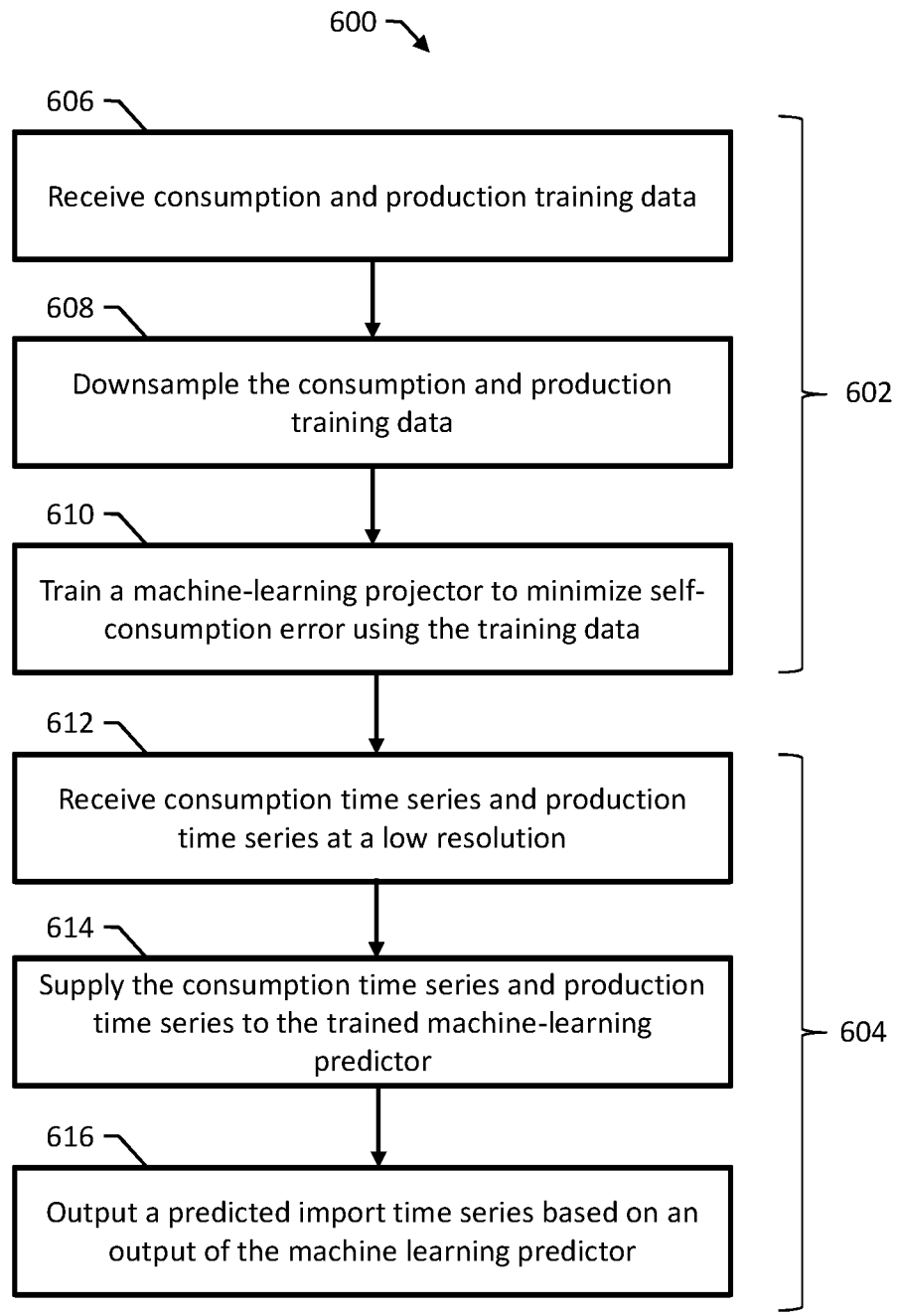
FIG. 6 is a flow diagram of an example method for determining electric energy flow predictions for electric systems including photovoltaic solar systems.

FIG. 6 is a flow diagram of an example method 600 for determining electric energy flow predictions for electric systems including photovoltaic solar systems. The method includes a training phase 602 performed prior to a production phase 604. The same computer system may perform both phases of the method 600; however, in some examples, different computer systems may perform the training and production phases 602 and 604. For example, the computer system 400 of FIG. 4 can perform the training phase 602, and the computer system 500 of FIG. 5 can perform the production phase 604.

The computer system receives electric energy consumption training data and photovoltaic production training data (606). For example, the computer system can receive electric energy consumption training data and photovoltaic production training data at a high resolution as described above with reference to FIG. 4. The computer system downsamples the electric energy consumption training data and photovoltaic production training data to a low resolution (608). The computer system trains a machine-learning predictor to build a model to minimize self-consumption error between the electric energy consumption training data, the photovoltaic production training data, and the downsampled electric energy consumption training data and the downsampled photovoltaic production training data (610).

The computer system receives a consumption time series of electric consumption values for an electric system at the low resolution and a predicted production time series of electric production values for a prospective photovoltaic solar system for installation with the electric system (612). For example, the computer system can receive the consumption time series and the predicted production time series as described above with reference to FIGS. 3 and 5. The computer system supplies the consumption time series and the predicted production time series to the machine-learning predictor trained during the training phase (614). The computer system determines, using an output of the machine-learning predictor responsive to the consumption time series and the predicted production time series, a predicted import time series of electric import values (616). The electric import values may be spaced apart by time intervals at the low resolution.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method comprising:
receiving electric energy flow data for a photovoltaic (PV) electric system at a first data resolution from one or more sources;
supplying the electric energy flow data to a machine-learning predictor trained during a prior training phase using energy flow training data comprises at a second data resolution greater than the first data resolution, the electric energy flow data comprises energy consumption time series and predicted production time series, wherein the energy flow training data and the predicted production time series data include energy values spaced apart by a plurality of time intervals at the second data resolution such that a first plurality of time intervals are spaced apart by a first time difference, a second plurality of time intervals are spaced apart by a second time difference, and wherein the first time difference is greater than the second time difference;
receiving an output responsive to the supplied electric flow energy data from the machine-learning predictor;
determining, using the output of the machine-learning predictor, an energy flow prediction at the first data resolution;
exporting the energy flow prediction for display on a user device.

2. The method of claim 1, wherein receiving electric energy flow data from one or more sources includes receiving electric energy flow data from a user device, monitoring system associated with the PV electric system, an electric meter coupled to the PV electric system, a utility computer system, or a combination thereof.

3. The method of claim 1, wherein the energy consumption time series has a lower resolution than a metering resolution used by an electric utility at a site associated with the PV electric system.

4. The method of claim 1, wherein the determined energy flow prediction at the first data resolution is a predicted import time series of electric import values each specifying an amount of electric energy predicted to be imported by the PV electric system.

5. The method of claim 1, wherein the machine-learning predictor is trained during the prior training phase with electric energy flow training data downsampled to the first resolution, and wherein the machine-learning predictor is configured to build a model to minimize self-consumption error between electric energy flow training data and downsampled electric energy flow training data.

6. The method of claim 5, wherein the electric energy flow training data is downsampled to a first resolution used by a utility metering system.

7. The method of claim 1, wherein exporting the energy flow prediction for display on a user device comprises presenting to a user, in a graphical user interface, a target physical configuration of the PV electric system.

8. The method of claim 1, wherein exporting the energy flow prediction for display on a user device comprises presenting a predicted energy cost reduction by the PV electric system.

9. The method of claim 8, wherein the predicted energy cost reduction is predicted based on the energy flow prediction for the PV electrical system and a utility rate structure.

10. An electronic device, comprising processing circuitry configured to:
 transmit electric energy flow data for a photovoltaic (PV) electric system at a first data resolution to a server;
 the server being configured to:
 supply the electric energy flow data to a machine-learning predictor trained during a prior training phase using energy flow training data at a second data resolution greater than the first data resolution, the electric energy flow data comprises energy consumption time series and predicted energy production time series, wherein the energy flow training data and the predicted production time series data include energy values spaced apart by a plurality of time intervals at the second data resolution such that a first plurality of time intervals are spaced apart by a first time difference, a second plurality of time intervals are spaced apart by a second time difference, and wherein the first time difference is greater than the second time difference; and,
 generate an energy flow prediction at the first data resolution, and
 display the energy flow prediction generated by the server.

11. The method of claim 10, wherein the energy consumption time series has a lower resolution than a metering resolution used by an electric utility at a site associated with the PV electric system.

12. The method of claim 10, wherein the energy flow prediction generated by the server is a predicted import time series of electric import values each specifying an amount of electric energy predicted to be imported by the PV electric system.

13. The method of claim 10, wherein the machine-learning predictor is trained during the prior training phase with electric energy flow training data downsampled to the first resolution, and wherein the machine-learning predictor is configured to build a model to minimize self-consumption error between electric energy flow training data and downsampled electric energy flow training data.

14. The method of claim 13, wherein the electric energy flow training data is downsampled to a first resolution used by a utility metering system.

15. The method of claim 10, wherein the processing circuitry is further configured to display a target physical configuration of the PV electric system.

16. The method of claim 10, wherein the processing circuitry is further configured to display a predicted energy cost reduction by the PV electric system.

17. The method of claim 16, wherein the predicted energy cost reduction is predicted based on the energy flow prediction for the PV electrical system and a utility rate structure.

* * * * *